United States Patent [19]

Hasegawa

[11] Patent Number: 5,657,467
[45] Date of Patent: Aug. 12, 1997

[54] NON-VOLATILE SEMICONDUCTOR MEMORY DEVICE WITH INSTRUCTION ISSUE DURING BUSY CYCLE

[75] Inventor: Takashi Hasegawa, Kawasaki, Japan

[73] Assignee: Fujitsu Limited, Kawasaki, Japan

[21] Appl. No.: 371,581

[22] Filed: Jan. 12, 1995

Related U.S. Application Data

[63] Continuation of Ser. No. 188,762, Jan. 31, 1994, abandoned

[30] Foreign Application Priority Data

Mar. 18, 1993 [JP] Japan .................................. 5-058505

[51] Int. Cl.$^6$ ............................. G11C 11/40; G06F 13/14
[52] U.S. Cl. .................... 395/430; 395/495; 365/189.04
[58] Field of Search .................................. 395/430, 476, 395/477, 483, 495; 365/189.04, 189.05, 220

[56] References Cited

U.S. PATENT DOCUMENTS

| | | |
|---|---|---|
| 4,752,871 | 6/1988 | Sparks et al. |
| 4,970,692 | 11/1990 | Ali et al. ................................. 365/218 |
| 5,034,922 | 7/1991 | Burgess ............................ 365/189.07 |
| 5,224,070 | 6/1993 | Fandrich et al. ....................... 365/185 |
| 5,287,469 | 2/1994 | Tsuboi ..................................... 395/425 |

Primary Examiner—Jack B. Harvey
Assistant Examiner—Jeffrey K. Seto
Attorney, Agent, or Firm—Staas & Halsey

[57] ABSTRACT

A non-volatile semiconductor memory device includes a memory cell array including a plurality of memory cells, an address latch circuit supplied with address for latching the same, a data latch circuit supplied with data for latching the same, a sense amplifier for amplifying data read out from the memory cell array, a write control circuit for controlling write operation, a register for holding a predetermined data, and a selection circuit supplied with a busy signal from the write control circuit indicating that the semiconductor memory device is operating in a writing mode for writing data into the memory cell array, for selecting one of an output signal of the sense amplifier and an output signal of the register in response to the busy signal.

8 Claims, 6 Drawing Sheets

NON-VOLATILE SEMICONDUCTOR MEMORY DEVICE WITH INSTRUCTION ISSUE DURING BUSY CYCLE

This application is a continuation of application Ser. No. 08/188,762, filed Jan. 31, 1994, now abandoned.

BACKGROUND OF THE INVENTION

The present invention generally relates to non-volatile semiconductor memory devices such as electrically-erasable programmable read-only memories (EEPROMs) and data processors that use such non-volatile semiconductor memory devices. More particularly, the present invention relates to a data processing system that uses a non-volatile semiconductor memory device for storing both programs and data, wherein runaway of the system is effectively eliminated without causing a decrease in the system throughput, by way of adding a simple circuit.

Today, EEPROMs include various circuits such as a write control circuit and a high voltage generator and can be used similarly to a static random access memory (SRAM). In spite of these various improvements, however, the EEPROMs still have problems such as a long write interval, and associated with this, there has been a problem of slow accessing due to the fact that the reading of data cannot be started until the writing of data is completed.

Figure 1:
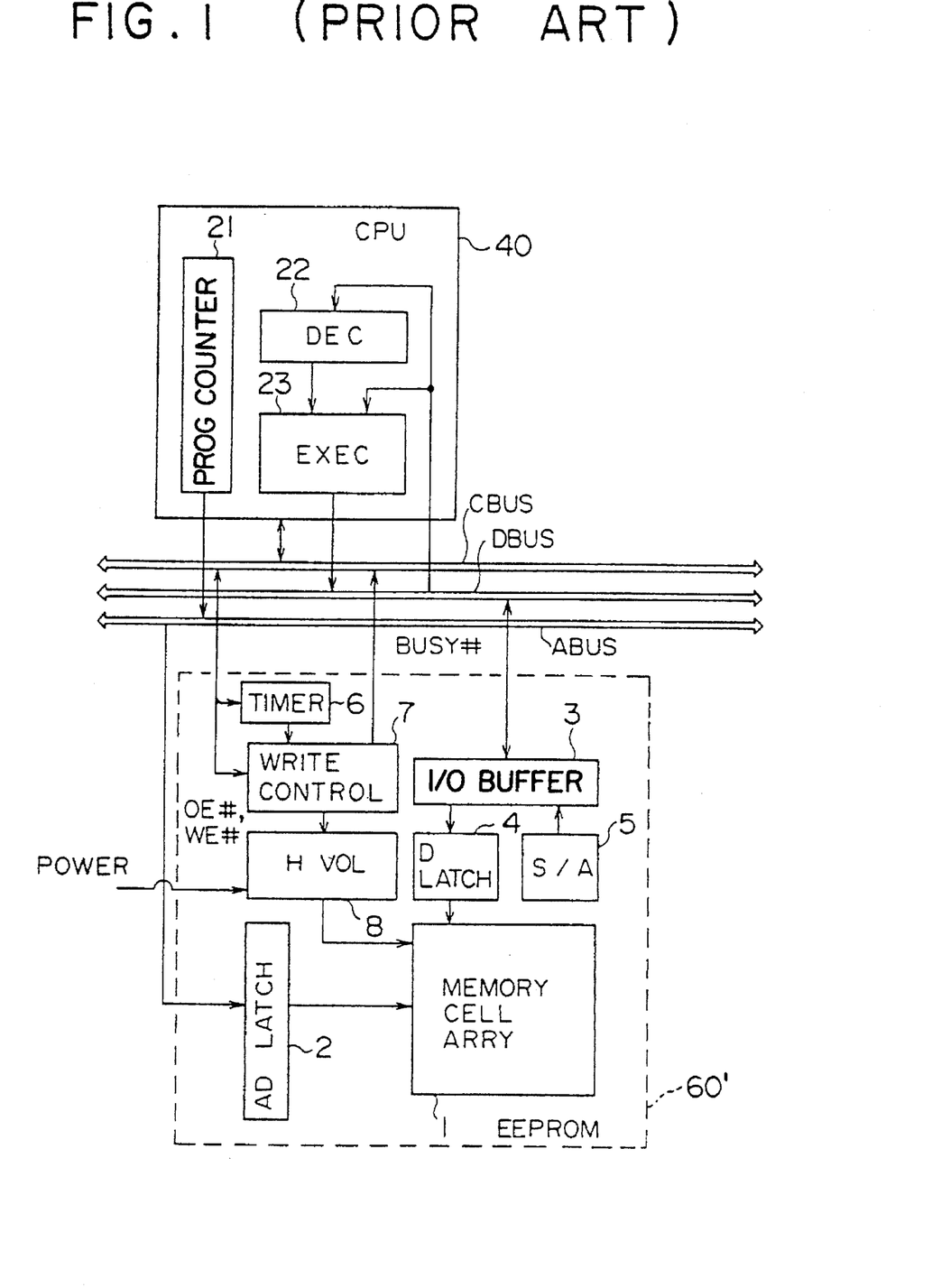
FIG. 1 is a diagram showing the construction of a conventional non-volatile semiconductor memory device.

FIG. 1 shows a typical construction of a conventional EEPROM.

Referring to FIG. 1 showing a part of a data processing system that includes a CPU 40 and EEPROM 60', it will be noted that the CPU 40 and the EEPROM 60' are connected with each other by a system bus IBUS that in turn includes a control bus CBUS, a data bus DBUS and an address bus ABUS.

The CPU 40 includes various elements wherein FIG. 1 shows only those elements that will be described later. These elements include a program counter 21, an instruction decoder 22 and an execution unit 23.

The EEPROM 60', in turn, includes a memory cell array 1 in which memory cells are arranged in rows and columns, an address latch 2 supplied with address data from an external address circuit for latching the same, an input/output buffer 3 for receiving and outputting data, a data latch 4 supplied with input data from an external circuit via the input/output buffer 3 for latching the same, a sense amplifier 5 for amplifying data read out from the memory cell array 1, a timer 6 for counting time, a write control circuit 7 controlled by control signals such as an output enable signal OE# and a write enable signal WE# as well as by the timer 6 for controlling the writing operation of the EEPROM 60', and a high voltage generator 8 that boosts an externally supplied power voltage (5 volts) to produce a boosted voltage (12 volts), wherein the boosted voltage is used for erasing and writing of data. Throughout the present specification, the logic inversion of logic signals will be represented by adding a symbol# after the name of the signal.

In the conventional EEPROM 60' having a construction as such, the write control circuit 7 carries out the following processes when writing data.

(1) First, the write control circuit 7 activates the address latch 2 as well as the data latch 4 to cause a latching of the address data and the data supplied externally.

(2) Next, the control circuit 7 activates the high voltage generator 8 for erasing the memory cell selected by the address data held in the address latch 2. The interval of the erasing is controlled by the timer 6.

(3) Next, the control circuit 7 deactivates the high voltage generator 8 and waits for the high voltage in the chip to disappear. This interval is controlled by the timer 6.

(4) Further, the control circuit 7 activates the high voltage generator 8 once more to cause a writing of the data held in the data latch 4 into the memory cell selected by the address data held in the address latch 2. The interval for this writing process is controlled by the timer 6.

(5) Next, the control circuit 7 deactivates the high voltage generator 8 and waits for the high voltage in the chip to disappear. The interval for this process is controlled by the timer 6.

(6) Finally, the control circuit 7 activates the read circuit to carry out a comparing process for verifying the data read out from the selected memory cell with the data held in the data latch 4.

In the foregoing processes (1)-(6), there may be a case wherein a confirmation step is interposed between the step (3) and the step (4) for confirming that the memory cell is erased.

In the foregoing operation, it should be noted that the EEPROM 60' is disconnected from the system bus IBUS by the address latch 2 and the data latch 4 as well as by the write control circuit 7 until the writing is completed. In other words, the reading from the EEPROM 60' is impossible in such a system during the write interval for writing data into the EEPROM 60'.

When reading of data is attempted while writing is still being made in such a system, one obtains meaningless data such as "111111 . . . " In order to prevent this, there are EEPROMS 60' that issue a busy signal such as BUSY# during the write interval. In fact, the conventional system of FIG. 1 issues such a busy signal when writing data. Alternatively, there are other types of EEPROM that do not have an output terminal for the busy signal BUSY#. In this EEPROM, a logic inversion of the written data or a part of the same is outputted. In any of these conventional EEPROMs, the content of the data that is read out during the write interval is meaningless.

Conventionally, EEPROMs have primarily been used for data memories, while the device can also be used for a program memory. In fact, the use of EEPROMs as a program memory is increasing these days. In such a data processing system that uses an EEPROM for the memory in addition to the conventional ROM and RAM, a memory space shown in FIG. 5 may be constructed.

Figure 5:
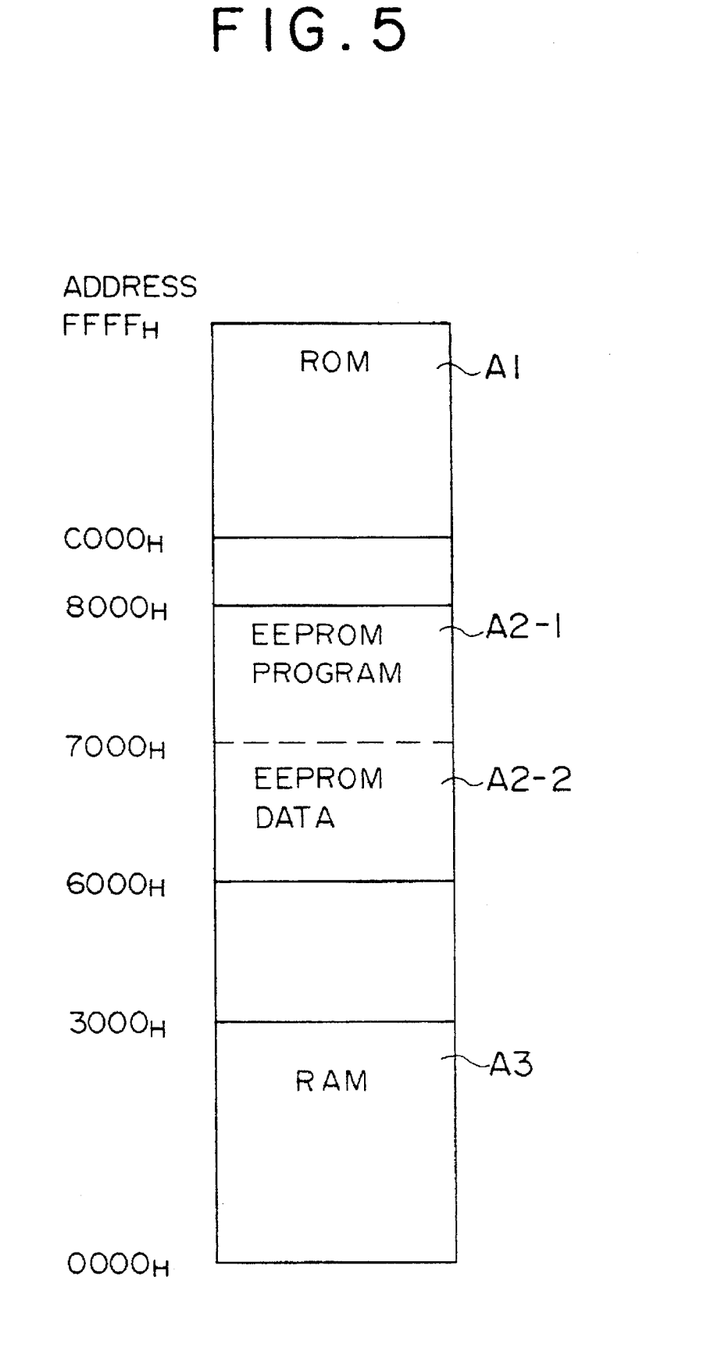
FIG. 5 is a diagram showing the construction of a memory space used in the single-chip computer of FIG. 4 as well as other conventional data processing systems.

Referring to the memory space of FIG. 5, it will be noted that the EEPROM has a first address area A2-2 extending from 6000H to 6FFFH (the last H designates that the value preceding the same is a hexadecimal number) for data and a second memory area A2-1 extending from 7000H to 7FFFH for programs. More specifically, programs or subroutines that rewrite the content of the memory area A2-2 are stored in the memory area A2-1.

Figure 2A:
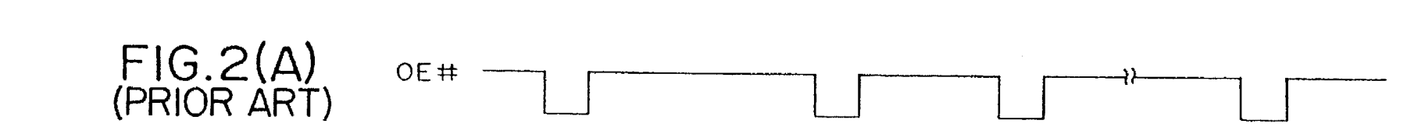
FIGS. 2(A)–2(D) are timing charts showing the operation of the conventional device of FIG. 1.
Figure 2B:
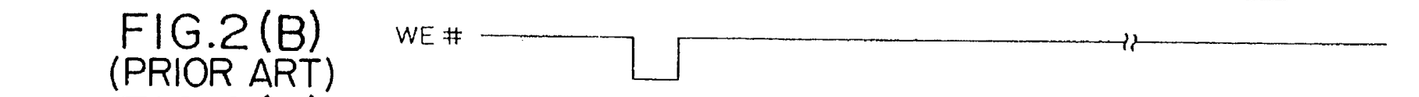
Figure 2C:
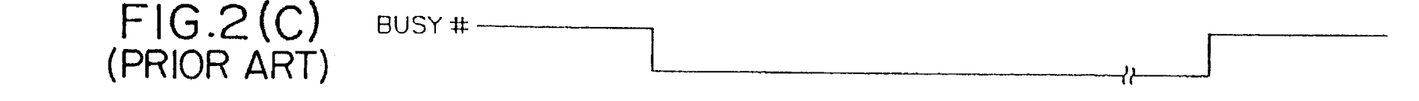
Figure 2D:
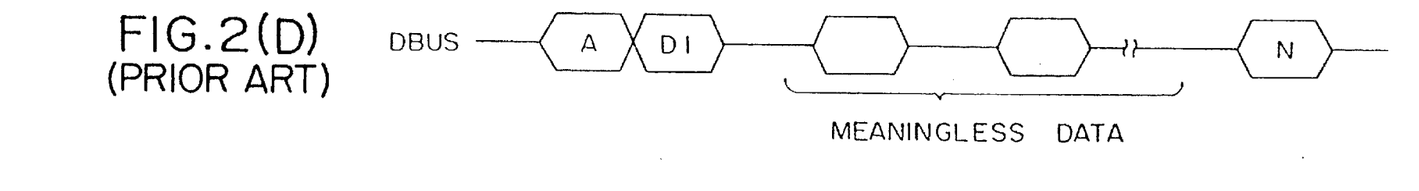

Next, the processing that occurs in a data processing system having such a memory space will be described with reference to FIG. 1 and a timing chart of FIGS. 2(A)–2(D). The processing of FIGS. 2(A)–2(D) includes the access of the EEPROM, wherein FIG. 2(A) shows the timing of the output enable signal OE#, FIG. 2(B) shows the timing of the write enable signal WE#, FIG. 2(C) shows the timing of the busy signal BUSY#, and FIG. 2(D) shows the timing of the data outputted on the data bus DBUS.

When the program counter 21 in the CPU 40 selects the program memory area A2-1 of the EEPROM 60', the instructions are read out consecutively from the EEPROM 60' and decoded by the instruction decoder 22. The instructions thus decoded are then executed by the execution unit 23.

When there is an instruction A for writing data D1 into the data memory area A2-2 of the EEPROM 60', the CPU 40 supplies the data D1 to the data bus DBUS and the address data to the address bus ABUS. Further, the CPU 40 activates the write enable signal WE#. In response to these, the EEPROM 60' starts the writing procedure according to the steps described before. During this interval for writing data (usually several milliseconds to several tens of milliseconds), the busy signal BUSY# is turned active as already noted. In the interval wherein the signal BUSY# is active, no normal reading operation from the EEPROM 60' is possible. When the reading of data is attempted during such an interval, the CPU 40 acquires meaningless data as instruction, and such erroneous data may cause a runaway of the system.

In order to eliminate the problem of malfunctioning of the system, conventional data processing systems have used one or more of the following remedies.

(1) Provide a plurality of EEPROMs in correspondence to the storage of programs and storage of data.

(2) Halt the CPU during the interval in which the busy signal BUSY# is active.

(3) Issue a hardware interrupt when the EEPROM has made a reading during the write interval.

The first option (1) to use plurality of EEPROMs obviously requires excessive cost and is disadvantageous from the view point of constructing the CPU 40 and the EEPROM 60' on a common monolithic chip. The second option (2), on the other hand, has an obvious disadvantage that the CPU 40 cannot carry out any processes while writing is being made into the EEPROM 60'. Thereby, the advantage of the system to disconnect the EEPROM 60' from the rest of the system by providing the write control circuit 7, disappears entirely. Further, the third option (3) for carrying out an interruption routine requires an exceptional process by software, while such a process, being a non-real time processing, causes a problem of software overhead.

SUMMARY OF THE INVENTION

Accordingly, it is an object of the present invention to provide a novel and useful data processing system and a non-volatile semiconductor memory device used therein, wherein the foregoing problems are eliminated.

Another object of the present invention is to provide a novel and useful data processing system that uses a non-volatile semiconductor memory device both for storing programs and storing data as well as such a non-volatile semiconductor memory device, wherein the runaway of the system is eliminated without decreasing the system throughput, by adding a simple circuit.

Another object of the present invention is to provide a non-volatile semiconductor memory device, comprising:

a memory cell array including a plurality of memory cells, each of said plurality of memory cells storing information therein;

address latch means supplied with address for latching the same;

data latch means supplied with data for latching the same;

sense amplifier means for amplifying information read out from said memory cell array;

a write control circuit for controlling a write operation for writing information into a selected memory cell selected by said address, said write control circuit producing a busy signal while conducting said write operation indicating that said semiconductor memory device is carrying out said write operation;

a register for holding a predetermined data; and selection means supplied with said busy signal from said write control circuit, for selecting one of an output signal of said sense amplifier and an output signal of said register in response to said busy signal, said selection means outputting said selected signal as output information of said non-volatile semiconductor memory device.

According to the present invention, the selection means produces the content of the predetermined data held in the register when the writing is made into the memory cell array, and the CPU uses such predetermined data as the instruction. By setting the content of the predetermined data appropriately, one can avoid the problem of the CPU and hence the data processing system causing a runaway as a result of feeding erroneous or inappropriate information to the CPU as instruction. In the present invention, the register and the selection means have a simple construction, and the decrease of throughput of the data processing does not occur even when such additional circuit is provided.

Another object of the present invention is to provide a data processing system, comprising:

a central processing unit supplied with instructions for executing the same;

a non-volatile semiconductor memory device, comprising: a memory cell array including a plurality of memory cells, each of said plurality of memory cells storing information therein; address latch means supplied with address for latching the same; data latch means supplied with data for latching the same; sense amplifier means for amplifying information read out from said memory cell array; a write control circuit for controlling a write operation for writing information into a selected memory cell selected by said address, said write control circuit producing a busy signal while conducting said write operation indicating that said semiconductor memory device is carrying out said write operation; a register for holding a predetermined data; and selection means supplied with said busy signal from said write control circuit, for selecting one of an output signal of said sense amplifier and an output signal of said register in response to said busy signal, said selection means outputting said selected signal as output information of said non-volatile semiconductor memory device; and a system bus for connecting said central processing unit and said non-volatile semiconductor memory device with each other;

said selection means supplying said predetermined data held in said register to said central processing unit, when said central processing unit has issued a request for reading said non-volatile semiconductor memory device during an interval in which said non-volatile semiconductor memory device is written with information, as an instruction.

In a preferred embodiment of the present invention, said register holds therein a relative-address jump instruction for causing a jump to a relative-address that is the same address before said jump is made, as said predetermined data.

In another preferred embodiment of the present invention, said register holds therein a software interruption instruction as said predetermined data.

In another preferred embodiment of the present invention, said register holds therein an absolute-address jump instruction for causing a jump to an absolute-address specifying a program stored in memory means other than the said non-volatile semiconductor memory device, as said predetermined data.

In still another preferred embodiment of the present invention, said predetermined data held in the register is set by said central processing unit.

According to the present invention as set forth in the first preferred embodiment above, one can avoid runaway of the data processing system by setting a relative-address jump instruction in the register as the predetermined data. Thereby, the central processing unit carries out a looping operation without changing the value of the program counter in the central processing unit in response to the busy signal, as long as the non-volatile semiconductor memory device is in the writing mode. When the writing is completed and the busy signal has become inactive, the selection means outputs the instructions to be executed by the central processing unit in place of the foregoing dummy instruction that has caused the foregoing looping operation to the same address, and the problem of runaway of the system is avoided.

Alternatively, one may set a software interruption instruction in the register as the foregoing predetermined data. In this case, the software interruption instruction is supplied to the central processing unit when the central processing unit has issued a read request to the non-volatile semiconductor memory device while the non-volatile semiconductor memory device is being written with information. Thereby, the central processing unit carries out an exceptional operation for the interruption processing routine in response to the foregoing instruction set in the register. In this case, too, the runaway of the system is successfully avoided.

Further, one may set an absolute jump instruction for jumping to a program held in other memory means such as a read only memory, in the register as the foregoing predetermined data. In this case, the central processing unit executes other possible instructions in response to the jump instruction when the reading of the non-volatile semiconductor memory device is attempted while it is being written with information. Again, the problem of runaway of the system by attempting to read the non-volatile semiconductor memory device during the write interval, is successfully avoided.

Other objects and further features of the present invention will become apparent from the following detailed description when read in conjunction with the attached drawings.

DETAILED DESCRIPTION OF THE PREFERRED EMBODIMENTS

Figure 3:
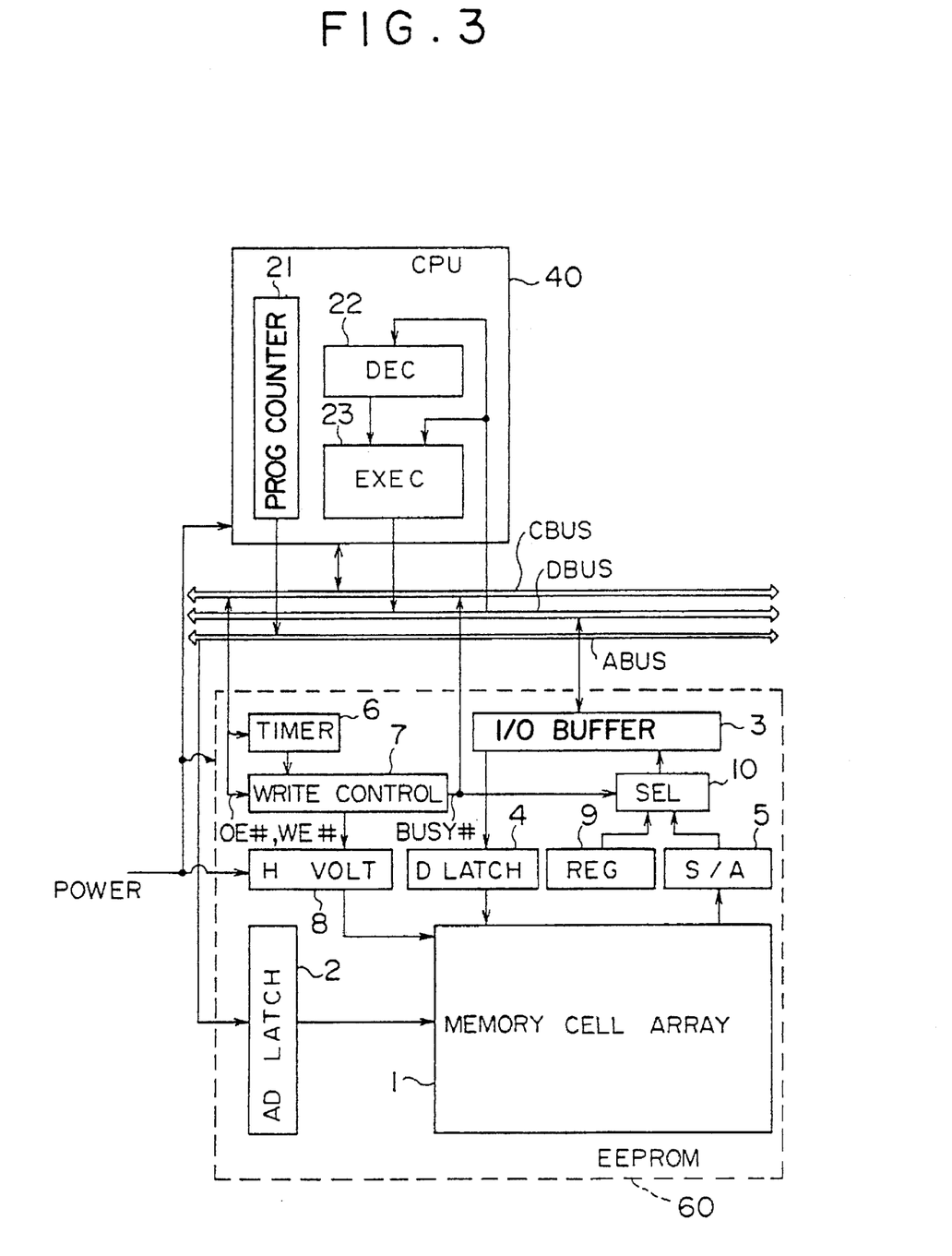
FIG. 3 is a diagram showing the construction of a non-volatile semiconductor memory device according to an embodiment of the present invention.

FIG. 3 shows the construction of a single-chip microcontroller (SMC) that incorporates therein a non-volatile semiconductor memory device according to a first embodiment of the present invention. In FIG. 3, those parts constructed similarly to the parts shown in FIG. 1 are designated by corresponding reference numerals.

Referring to FIG. 3, the SMC includes a CPU 40 and an EEPROM 60 forming the non-volatile semiconductor memory device, wherein the CPU 40 and the EEPROM 60 are connected with each other by an internal system bus IBUS that includes a control bus CBUS, a data bus DBUS and an address bus ABUS.

The CPU 40 includes various elements as usual wherein FIG. 3 shows only a program counter 21, an instruction decoder 22 and an execution unit 23 that will be referred to in the following description.

The EEPROM 60 includes a memory cell array 1 in which memory cells for storing information are arranged in rows and columns, an address latch 2 supplied externally with address data for latching the same, an input/output buffer 3 for inputting and outputting data, a data latch 4 for latching the data supplied externally via the input/output buffer 3, a sense amplifier 5 for amplifying information read out from the memory cell array 1, a timer 6, a write control circuit 7 for controlling a write mode operation of the EEPROM in response to a control signal and a timer 6, and a high voltage generator 8 for producing a high voltage necessary for carrying out erasing and writing of data, wherein the foregoing control signal that controls the write control circuit 7 includes signals such as an output enable signal OE#, a write enable signal WE#, . . . Further, the SMC of FIG. 3 includes a register 9 for holding a predetermined data and a selector 10 that is supplied with a busy signal BUSY# from the write control circuit 7, wherein the selector 10 outputs one of the predetermined data held in the register 9 and the output of the sense amplifier to the output buffer 3 in response to the busy signal BUSY#, such that the output of the sense amplifier is supplied to the output buffer 3 when the busy signal BUSY# is inactive and such that the predetermined data in the register 9 is supplied to the output buffer 3 when the busy signal BUSY# is active.

The operation of the write circuit 7 of the EEPROM 60 is identical with the operation of the write circuit 7 in the EEPROM 60' of FIG. 1.

Figure 4:
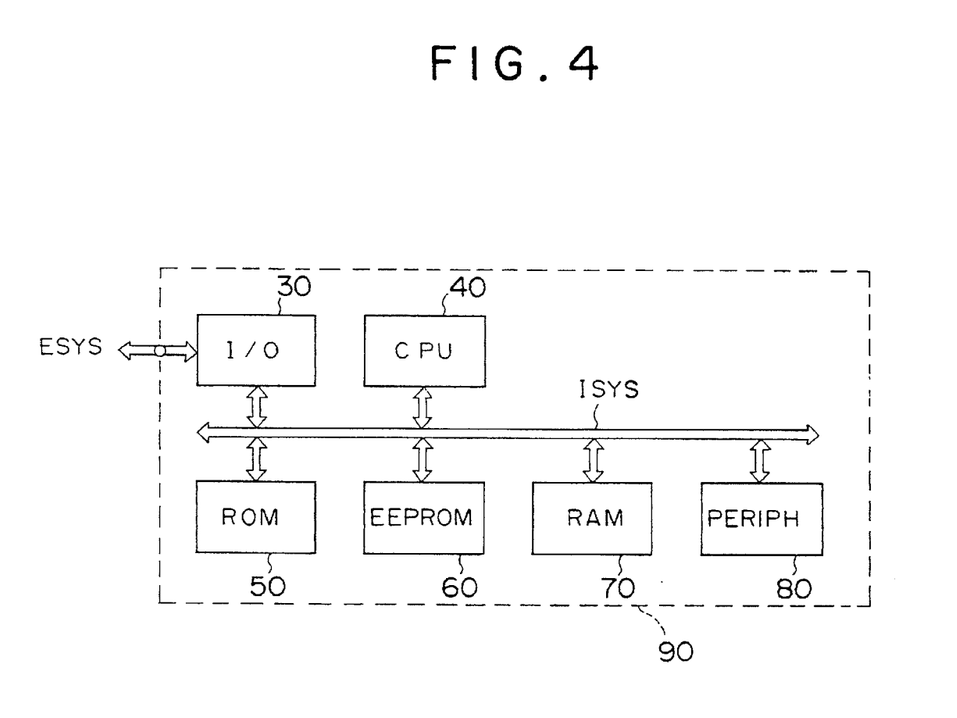
FIG. 4 is a diagram showing the construction of a single-chip computer on which the non-volatile semiconductor memory device of FIG. 3 is provided.

The EEPROM 60 of the present embodiment is used for example in a single-chip computer 90 shown in FIG. 4.

Referring to FIG. 4, the single-chip computer 90 includes a CPU 40 connected to memories that includes a ROM 50 and a RAM 70 in addition to the EEPROM 60 via an internal system bus ISYS, wherein a peripheral circuit 80 and an input/output interface port 30 are also connected to the system bus ISYS. Thereby, the system bus ISYS is connected to an external system bus ESYS via the interface port 30.

The single-chip computer 90 of FIG. 4 has a memory space configured as shown in FIG. 5, wherein the memory space is divided into the area allocated to the ROM 50, the area allocated to the EEPROM 60 and the area allocated to the RAM 70 as indicated in FIG. 5. It will be noted that the memory space extending from the address 6000H to the address 6FFFH is used for the data memory area A2-2 while the memory space from the address 7000H to the address 7FFFH is allocated to the program memory are A2-1. Thereby, it will be noted that the EEPROM 60 is used for storing both programs and data.

Figures 6A, 6B:
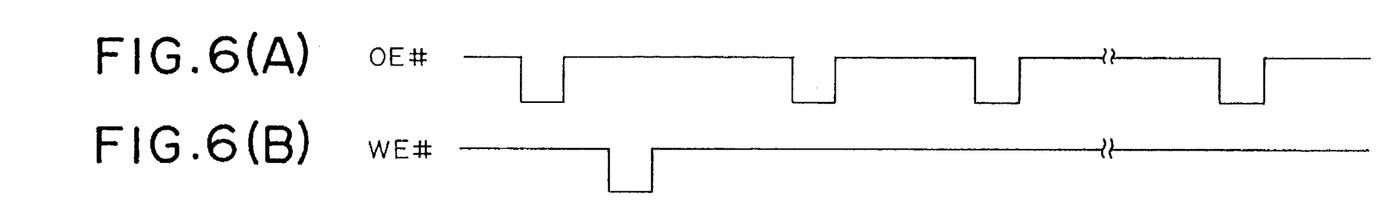
FIGS. 6(A)–6(E) are timing charts showing the operation of the non-volatile semiconductor memory device of FIG. 3.
Figure 6C:
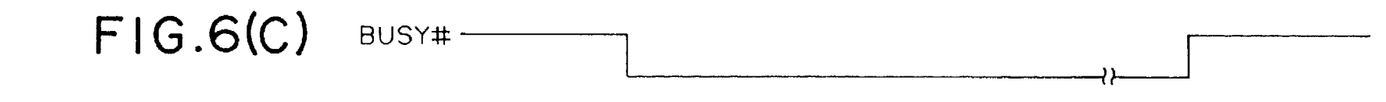
Figure 6D:
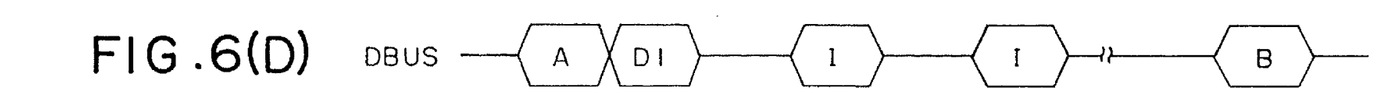
Figure 6E:
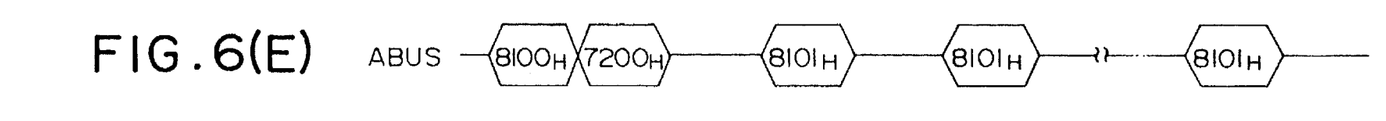

FIGS. 6(A)–6(E) are timing charts showing the processing that the CPU 40 achieves in the data processing system having such a memory space, wherein the CPU 40 carries out the processing while referring to the EEPROM 60. It should be noted that FIG. 6(A) shows the timing of the output enable signal OE#, FIG. 6(B) shows the timing of the write enable signal WE#, FIG. 6(C) shows the timing of the busy signal BUSY#, FIG. 6(D) shows the timing of the data outputted on the data bus DBUS, and FIG. 6(E) shows the timing of the address data supplied to the address bus ABUS. Referring to FIGS. 6(A)–6(E), the CPU 40 reads out an instruction from the memory area A2-1 allocated to the EEPROM 60 when the program counter 21 in the CPU 40 selects the memory area A2-1, and the instruction thus read out is decoded by the instruction decoder 22 and executed in the execution unit 23.

When an instruction A at the address 8100H, for example, is the instruction to write data D1 into the data memory area A2-2 of the EEPROM 60, the CPU 40 supplies the data D1 to the data bus DBUS and address data 7200H to the address bus ABUS. Further, the write enable signal WE# is set active. In response to the write enable signal WE#, the EEPROM 50 starts writing according to a predetermined sequence. Until the writing is completed, the busy signal BUSY# is issued, and the selector 10 selects the register 9 such that the content of the register 9 is outputted from the selector 10 to the input/output buffer 3.

Thus, when there is a request from the CPU 40 to read an instruction from the EEPROM 60 during such an interval, the content held in the register 9 is outputted from the EEPROM 60, and the CPU 40 executes the content of the register 9 as an instruction.

In the present embodiment, the register 9 holds a relative-address jump instruction I that causes a jump to a relative-address that is the same address wherein the instruction I for causing the relative-address jump is stored. Thereby, the value of the program counter 21 in the CPU 40 is held constant at 81081H as long as the busy signal BUSY# is active in correspondence to the writing of data into the EEPROM 60, and the process step of the CPU 40 loops back to the foregoing address of 81081H. When the writing has been completed and the busy signal BUSY# turned to be non-active, the selector 10 supplies a next instruction B stored after the foregoing address 81081H for the instruction A.

As set forth above, the present embodiment eliminates the runaway of the data processing system 90 that uses the EEPROM 60 for storing both program and data, by adding the register 9 and the selector 10 such that the CPU 40 conducts a looping operation for looping back to the same address while the writing of the data to the EEPROM is being made. After the writing of the data is completed, the next instruction B is executed.

Next, a second embodiment of the present invention will be described.

In the present embodiment, the register 9 holds therein a software interruption instruction. Thus, when the CPU 40 issues a read request for reading the content of the EEPROM 60 while the EEPROM 60 is being written with information, the software interruption instruction in the register 9 is supplied to the CPU 40 via the selector 10. Thereby, the CPU 40 executes an exceptional processing according to an interruption routine, in response to the foregoing software interruption instruction.

By storing the software interruption instruction in the register 9 as set forth above, one can eliminate the problem of runaway of the data processing system 90 similarly to the first embodiment. Further, by setting the duration for the foregoing interruption processing routine to be substantially equal to the duration needed for writing the EEPROM 60, the CPU 40 returns to the processing of the next instruction B immediately after the writing of the EEPROM 60 is completed, by reading out the instruction saved in a stack.

Next, a third embodiment of the present invention will be described. In the present embodiment, too, the hardware construction of FIG. 2 is used for the data processing system 90.

In the present embodiment, the register 9 holds a jump instruction for causing a jump to an absolute address. The absolute address to which the jump should be made is set to be the first address of the program that is stored in a memory device other than the EEPROM 60 such as the ROM 50 or the RAM 70.

Thus, when the CPU 40 issues a read request for reading the content of the EEPROM 60 while the EEPROM 60 is being written with information, the jump instruction in the register 9 to cause the jump to the absolute address is executed and the CPU 40 carries out a processing that can be achieved before the writing of the EEPROM 60 is completed. Thereby, the present invention eliminates the decrease of the throughput of the data processing system while simultaneously eliminating the runaway of the system.

It should be noted that one can store various instructions in the register 9 to eliminate the runaway of the data processing system such as a NO operation that executes nothing. Further, one may set the foregoing predetermined instruction stored in the register 9 from the CPU 40. Thereby, a versatile processing of the system becomes possible by way of software for eliminating the runaway of the system.

Further, the present invention is not limited to the embodiments described heretofore, but various variations and modifications may be made without departing from the scope of the invention.

What is claimed is:

1. A non-volatile semiconductor memory device, comprising:
   a memory cell array including a plurality of memory cells, each of said plurality of memory cells storing information therein;
   address latch means supplied with an address for latching the address;
   data latch means supplied with data for latching the data;
   sense amplifier means for amplifying information read out from said memory cell array;
   a write control circuit controlling a write operation for writing information into a selected memory cell selected by said address, said write control circuit producing a busy signal while conducting said write operation indicating that said semiconductor memory device is carrying out said write operation;
   a register holding a predetermined data; and
   selection means, supplied with said busy signal from said write control circuit, for selecting one of an output signal of said sense amplifier means and an output signal of said register in response to said busy signal, said selection means outputting said selected signal as output information of said non-volatile semiconductor memory device,
   said selection means allowing reading of said register while said write control circuit is writing information into a selected memory cell.

2. A data processing system, comprising:
   a central processing unit supplied with instructions for executing the instructions;

a non-volatile semiconductor memory device, comprising:
  a memory cell array including a plurality of memory cells, each of said plurality of memory cells storing information therein;
  address latch means, supplied with address, for latching the address;
  data latch means, supplied with data, for latching the data;
  sense amplifier means for amplifying information read out from said memory cell array;
  a write control circuit controlling a write operation for writing information into a selected memory cell selected by said address, said write control circuit producing a busy signal while conducting said write operation indicating that said semiconductor memory device is carrying out said write operation;
  a register holding a predetermined data; and
  selection means, supplied with said busy signal from said write control circuit, for selecting one of an output signal of said sense amplifier means and an output signal of said register in response to said busy signal, said selection means outputting said selected signal as output information of said non-volatile semiconductor memory device; and
a system bus connecting said central processing unit and said non-volatile semiconductor memory device with each other, wherein
  said selection means supplying said predetermined data held in said register to said central processing unit, when said central processing unit has issued a request for reading said non-volatile semiconductor memory device during an interval in which said non-volatile semiconductor memory device is written with information, as an instruction,
  said selection means allowing reading of said register while said write control circuit is writing information into a selected memory cell.

3. A data processing system as claimed in claim 2, wherein said register holds therein a relative-address jump instruction for causing a jump to a relative-address that is the same address before said jump is made, as said predetermined data.

4. A data processing system as claimed in claim 2, wherein said register holds therein a software interruption instruction as said predetermined data.

5. A data processing system as claimed in claim 2, wherein said register holds therein an absolute-address jump instruction for causing a jump to an absolute-address specifying a program stored in memory means other than the said non-volatile semiconductor memory device, as said predetermined data.

6. A data processing system as claimed in claim 2, wherein said predetermined data held in the register is set by said central processing unit.

7. A non-volatile semiconductor memory device, comprising:
  a memory cell array including a plurality of memory cells, each of said plurality of memory cells storing information therein;
  address latch means, supplied with address, for latching the address;
  data latching means, supplied with data, for latching the data;
  sense amplifier means for amplifying information read out from said memory cell array;
  a register holding a predetermined data; and
  selection means, supplied with a busy signal indicating that said semiconductor memory device is carrying out a write operation, for writing information into a selected memory cell selected by said address, said selection means selecting one of an output signal of said sense amplifier means and an output signal of said register in response to said busy signal, and said selection means outputting said selected signal as output information of said non-volatile semiconductor memory device,
  said selection means allowing reading of said register while said write control circuit is writing information into a selected memory cell.

8. A non-volatile semiconductor memory device, comprising:
  a memory cell array including a plurality of memory cells, each of said plurality of memory cells storing information therein;
  address latch means supplied with an address for latching the address;
  a data latch supplied with data for latching the data;
  a sense amplifier amplifying information read out from said memory cell array;
  a write control circuit controlling a write operation for writing information into a selected memory cell selected by said address, said write control circuit producing a busy signal while conducting said write operation indicating that said semiconductor memory device is carrying out said write operation;
  a register holding a predetermined data; and
  a selector, supplied with said busy signal from said write control circuit, selecting one of an output signal of said sense amplifier and an output signal of said register in response to said busy signal, said selector outputting said selected signal as output information of said non-volatile semiconductor memory device,
  said selector allowing reading of said register while said write control circuit is writing information into a selected memory cell.

* * * * *